United States Patent [19]

Fabian et al.

[11] Patent Number: 5,080,609
[45] Date of Patent: Jan. 14, 1992

[54] STACKED ELECTRICAL ASSEMBLY

[75] Inventors: David J. Fabian, Mt. Joy; Timothy L. Kocher, Camp Hill; Martha L. Rupert, Hummelstown, all of Pa.

[73] Assignee: AMP Incorporated, Harrisburg, Pa.

[21] Appl. No.: 700,084

[22] Filed: May 6, 1991

Related U.S. Application Data

[63] Continuation of Ser. No. 560,715, Jul. 31, 1990, abandoned.

[51] Int. Cl.⁵ ............................................. H01R 9/09
[52] U.S. Cl. .................................... 439/540; 439/569; 439/67; 439/564
[58] Field of Search ............... 439/67, 77, 79, 492, 439/498, 92, 95, 607, 609, 610, 608, 540, 108, 931, 569, 570, 562-564

[56] References Cited

U.S. PATENT DOCUMENTS

| | | | |
|---|---|---|---|
| 3,727,168 | 4/1973 | Henschen et al. | 439/498 |
| 4,818,239 | 4/1989 | Erk | 439/55 |
| 4,871,315 | 10/1989 | Noschese | 439/77 X |
| 4,878,856 | 11/1989 | Maxwell | 439/540 |
| 4,894,015 | 1/1990 | Stockero et al. | 439/67 |
| 4,902,236 | 2/1990 | Hasircoglu | 439/67 X |

OTHER PUBLICATIONS

"Electronic Components", Mar. 1990, p. 64.
"Positronic Industries, Inc." catalog, p. 9, Feb. 1988.

*Primary Examiner*—Daniel W. Howell
*Assistant Examiner*—Julie R. Daulton
*Attorney, Agent, or Firm*—David L. Smith

[57] ABSTRACT

A stacked electrical connector assembly (2) is disclosed of surface mounting on a circuit board (CB). The assembly comprises a sheet metal supporting bracket (4) having superposed upper and lower connector mounting lugs (20 and 24). An upper standard electrical connector (38) is mounted to the upper mounting lugs (20), a lower standard pin header connector N) being mounted to the lower mounting lugs (24). The pins (54) of the pin header connector (10) are connected to contact tails (46) of the upper connector (38) by means of a flat flexible cable (12). A lower standard multi-contact electrical connector (8) is mounted to the lower lugs (24) in front of the pin header connector (10) and has contact tails (76) projecting below the bracket (4). The assembly can be mounted on the circuit board (CB) by means of boardlocks (14) passed through holes in the lower mounting lugs (24) and in flanges (56 and 78) of the lower connectors (8 and 10) so that the contact tails (76) and lower portions of the pins (54) extend into holes in the circuit board (CB). Spring locking clips (14) serve to ground the bracket (4) to ground conductors on the circuit board.

31 Claims, 14 Drawing Sheets

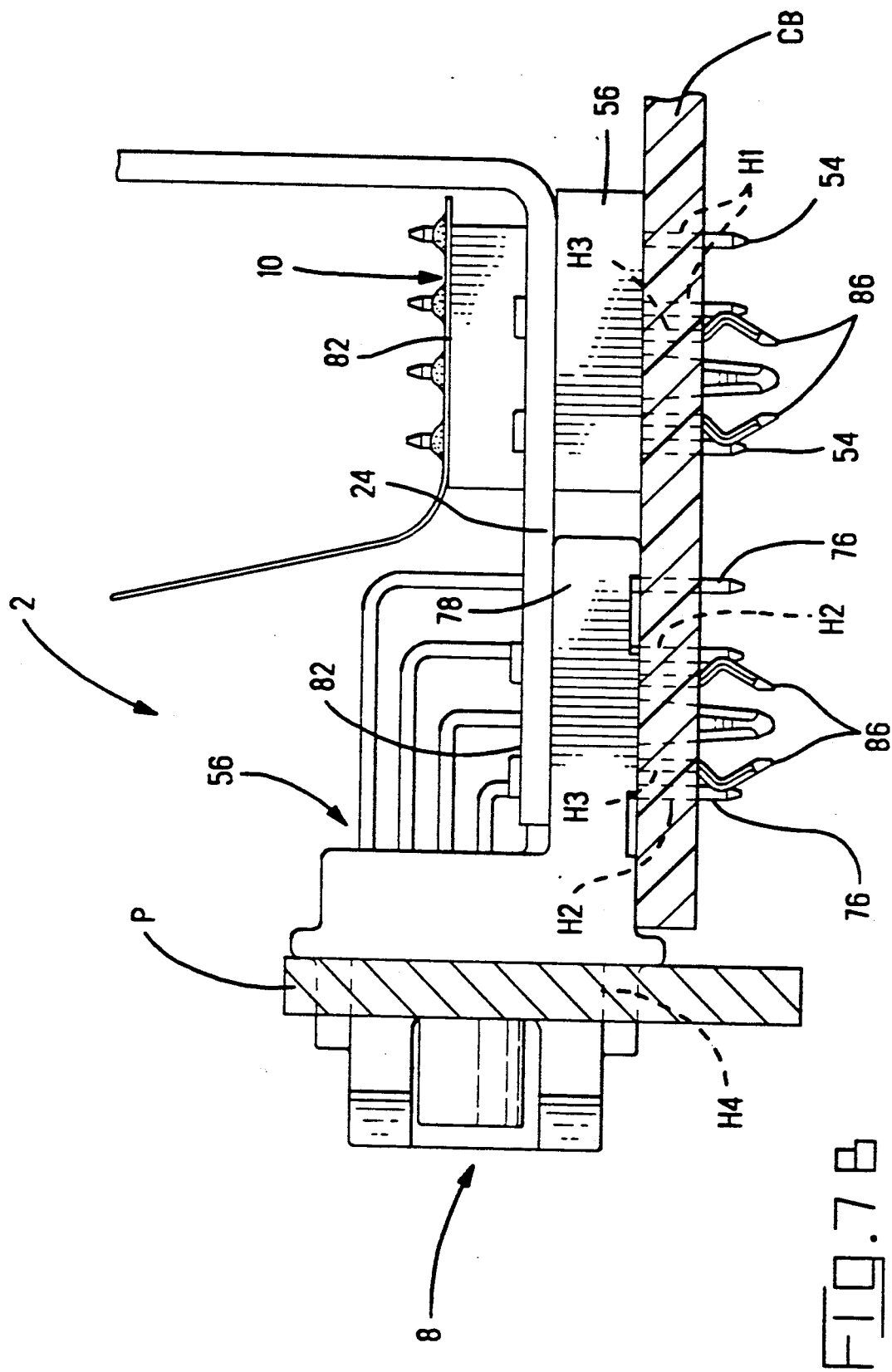

STACKED ELECTRICAL ASSEMBLY

This application is a continuation of application Ser. No. 07/560,715 filed July 31, 1990, now abandoned.

BACKGROUND OF THE INVENTION

This invention relates to a stacked electrical connector assembly for mounting on a circuit board and in particular to an assembly which can include standard electrical connectors and standard pin headers of various types or sizes.

There is described in U.S. Pat. No. 4,818,239 and U.S. Pat. No. 4,878,856, means for stacking multi contact electrical connectors in superposed relationship for mounting on a circuit board. Such means comprise a pair of metal brackets for supporting the connectors in their superposed relationship and a pin extension member comprising an insulating housing with electrical contact elements therein for mating with the upper connector of the stack to connect the contact elements thereof to conductors on the printed circuit board. According to U.S. Pat. No. 4,818,239, the metal brackets each comprise a plate having at opposite ends thereof flanges which are secured to mounting ears at the ends of the connectors. The metal brackets are disposed between the stacked connectors, and so do not engage the circuit board and are not intended to be secured thereto. The stack is attached to the circuit board only by inserting pins projecting from the pin extension member and from the bottom connector of the stack into plated through holes in the circuit board. According to U.S. Pat. No. 4,878,856, the metal brackets are right angled brackets, the upper parts of which are secured to respective mounting ears at the ends of the connector and the transverse parts of which are secured to the circuit board by means of spring metal fasteners. Both of the references teach that the pin extension member is necessarily rigid and the insulating housing must be dimensioned in accordance with the spacing between the upper and lower connectors.

U.S. Pat. No. 4,894,015 discloses the use of the flexible circuit interconnector for connecting projecting contact tails of a multi-contact electrical connector to a circuit board. Each conductor of the flexible circuit is soldered to a respective one of the contact tails and is also soldered to a respective conductor of the printed circuit board. No means are provided for stacking the connector with any other connector.

A stacked electrical connector assembly in which a longer electrical connector is mounted over a shorter electrical connector with two L-shaped brackets secured to the upper, longer connector with only one end of the shorter, lower connector secured to an supported by an L-shaped bracket is known. The second end of the shorter, lower connector floats and is not secured to any structure in the stacked electrical connector assembly. The upper connector of the known stacked electrical connector assembly has solder tails which are long enough to extend through a spacer plate positioned behind and at the same elevation as the lower connector.

SUMMARY OF THE INVENTION

The present invention provides a stacked electrical connector assembly for mounting on a circuit board in which the means for supporting the connectors in their stacked relationship can be appropriately dimensioned for the stacking of any desired combination of upper and lower connectors, the remaining parts of the assembly being standard items, and in which the supporting means can be grounded to provided to provide shielding for the circuitry of the assembly.

A stacked electrical connector assembly in accordance with the present invention for mounting on a circuit board comprises a connector supporting bracket which may be conveniently made of sheet metal, for example aluminum, the bracket having superposed upper and lower connector support means such as in the form of mounting lugs projecting from the bracket. One or more standard electrical connectors can be mounted to the upper supporting means, the or each connector having contact tails projecting from the terminals of the connector. One or more standard electrical connectors can be mounted to the lower supporting means, the or each lower electrical connector being in the form of a vertical pin header the pins of which have upwardly projecting portions and lower projecting portions protruding downwardly therefrom for insertion in holes in the circuit board. A length of flat flexible electrical cable, or a functional equivalent such as flexible circuit board or ribbon cable, having electrically conductive traces thereon is provided for interconnecting the terminals of the upper connectors to the pins of the pin header. Thus, each of the traces is connected at one end to a respective contact tail on an upper connector and at the other to the upper portion of a respective pin on the pin header. One or more lower electrical connectors, typically in the form of standard connectors may be mounted to the lower connector supporting means adjacent to the pin header.

The bracket can be dimensioned to support any number of upper and lower connectors of any convenient length at any desirable vertical or horizontal spacings. The flexible cable can be made to provide a ground plane for controlled impedance if desired. The flexible circuit may be dimensioned to extend directly between an upper connector and a pin header, or it may fold within the bracket. Thus, the same length of flexible cable can be used with a range of different spacing between the upper connector and the pin header with the result that a range of spacings between the upper and lower connectors can be accommodated.

Conveniently, the bracket can be grounded by means of resilient boardlocks passed through openings in the lower connector supporting means so as to be insertable into appropriate boardlock receiving apertures in the circuit board to complete a ground path between the bracket and ground conductors on the circuit board. The bracket may be shaped to provide the shielding needed and it may be opened at its top to allow a plurality of assemblies to be stacked one above the other, without shorting the downward projecting contact members, i.e. pins and/or contact tails, of an upper assembly with an assembly therebeneath.

BRIEF DESCRIPTION OF THE DRAWINGS

FIG. 7B is a fragmentary side view, partly in section, showing the assembly when mounted to the circuit board;

DESCRIPTION OF THE PREFERRED EMBODIMENT

Figure 1:
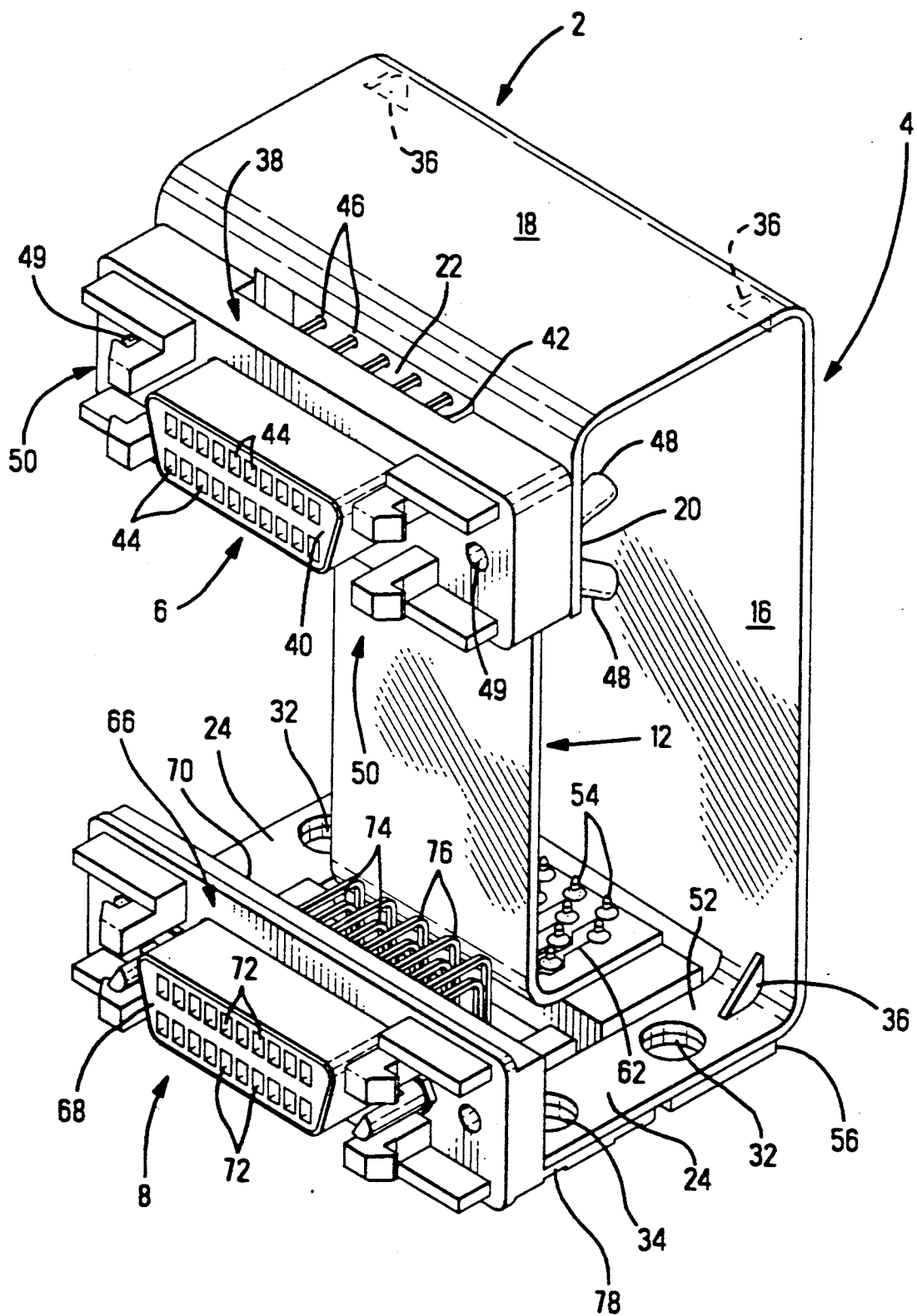
FIG. 1 is an isometric view of a stacked electrical connector assembly comprising a one piece stacking bracket, upper and lower multi-contact electrical connectors, a vertical pin header and a flat flexible cable interconnecting the terminals of the upper connector to the pins of the pin header, according to one embodiment of the invention.

A stacked electrical connector assembly 2 in accordance with the present invention will now be described by reference to the embodiment of FIGS. 1 to 7B. Stacked electrical connector assembly 2 comprises a one piece stacking bracket 4, upper and lower multi-contact electrical connectors 6 and 8, respectively, a vertical pin header 10, a flat flexible cable 12, and four resilient boardlocks 14. Bracket 4 which has been stamped and formed from a single piece of sheet metal stock, preferably aluminum, comprises an upright main plate 16 extending substantially vertically; a top flange 18 projecting forwardly from and at right angles to the upper edge of plate 16 along substantially the full length thereof, a pair of laterally spaced upper mounting lugs 20, each depending from the forward edge of the flange 18 at right angles thereto and proximate to one side thereof and defining a cut out 22 therebetween; and a pair of laterally spaced lower mounting lugs 24 each projecting forwardly from the lower edge of plate 16 at right angles thereto proximate to one side thereof in defining cut out 26 therebetween. Each lug 20 has two vertically spaced smaller mounting holes 28 located therebetween and outwardly thereof, a clearance hole 30 each mounting lug 24 having a pair of mounting holes 32 and 34, respectively, spaced forwardly from each other away from plate 16. Bent-in reinforcing ribs 36, shown in FIGS. 1 and 7A, may be provided between the main plate 16 and the lugs 24 as well as between plate 16 and flange 18.

Figure 2:
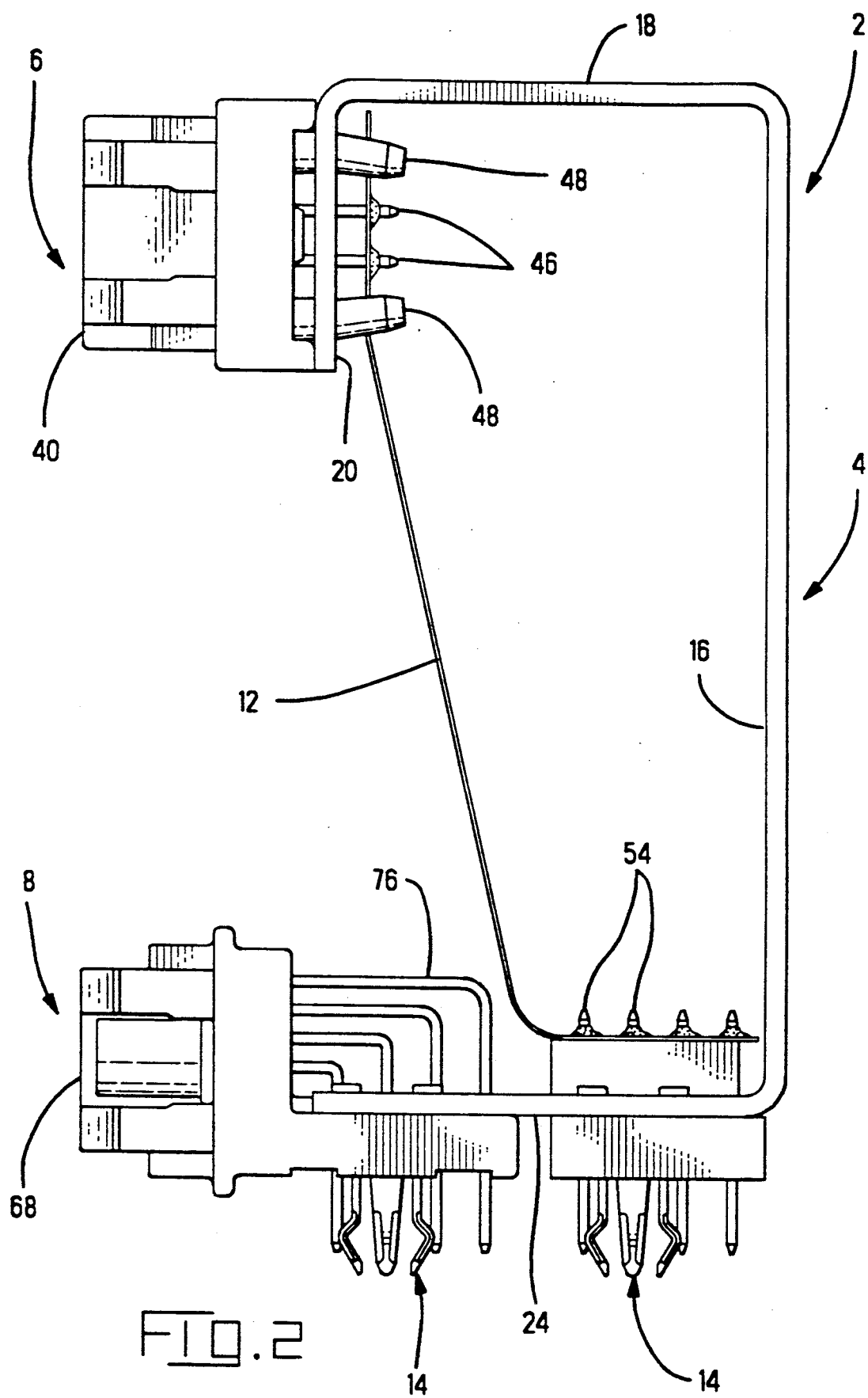
FIG. 2 is a side view of the assembly of FIG. 1 drawn to a smaller scale and illustrating modifications thereof.
Figure 3:
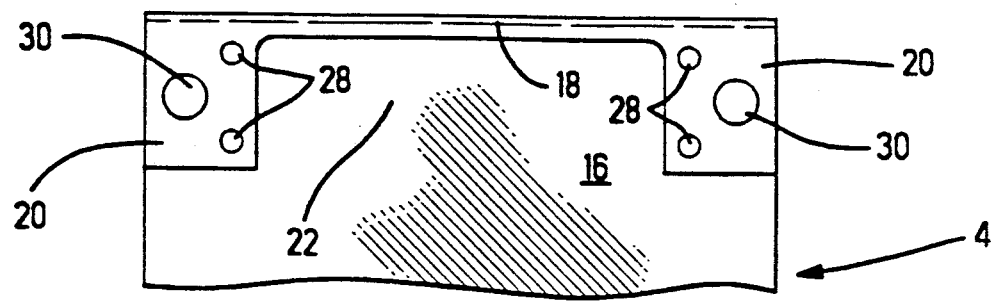
FIG. 3 is a fragmentary front view of the upper part of the bracket, drawn to the same scale as FIG. 2.
Figure 4:
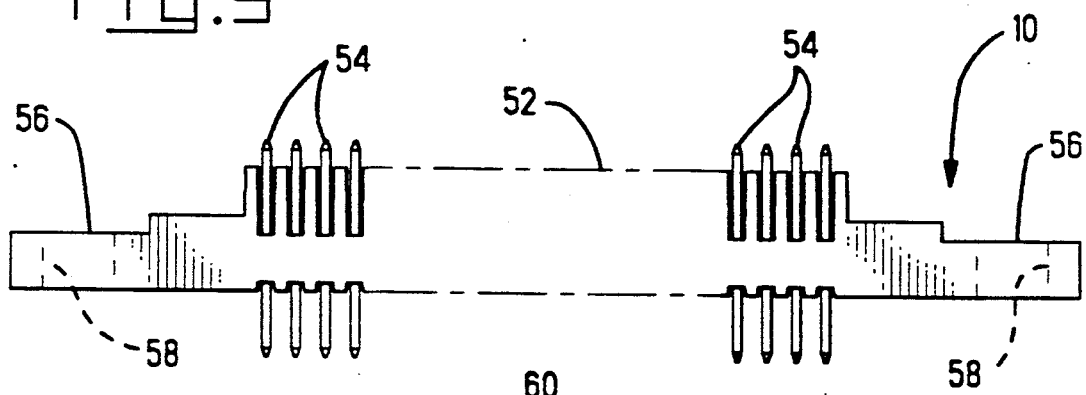
FIG. 4 is an elevational view of the pin header.

Connector 6 which preferably is a standard, off the shelf connector, comprises an elongate insulating housing 38 having a forward mating face 40 and a rear face 42, a plurality of rows of electrical terminal receiving through cavities 44, each opening onto both of said forward a rear faces and each receiving an electrical terminal having a mating portion (not shown) which may be either a pin or receptacle, proximate to the mating face 40 and a contact tail 46 projecting normally from the rear face 42 through cut out 22 of bracket 4. There projects from the face 42 of each end of the housing 38 a pair of solder posts 48, each extending through a respective mounting hole 28 and a respective lug 20 of flange 18 and which are preferably bent in opposite directions, that is to say upwardly and downwardly, to secure connector 6 to the mounting lugs 20 and thus to bracket 4. The posts 48 of each pair may alternatively be forced fitted into holes 28 or bent toward each other as shown in FIG. 2. Posts 48 should preferably be bent in the manner shown in FIG. 1.

Posts 48 electrically connect shielding wings of the connector 6 to bracket 4. Alternatively an external shield of the connector 6 may be electrically connected to bracket 4 by means of fasteners (not shown) passed through end holes 49 in housing 38 and holes 30 in lugs 20.

Pin header 10 in the preferred embodiment comprises an elongate housing 52 in the form of an insulating block through which extend a plurality of rows of electrical pins 54. Pins 54 each project from both the upper and lower faces of housing 52. At each end thereof the housing 52 is formed with a mounting lug 56 having a mounting hole 58 therethrough. While pin header 10 is shown as a vertical pin header, other pin headers such as a right angle pin header could be used. Each lug 56 extends beneath a respective lug 24 of bracket 4, the mounting hole 58 of lug 56 aligning with the respective mounting hole 32 in lug 24 when the parts of the stacked electrical connector assembly are assembled to the extent shown in FIG. 1.

Figure 5:
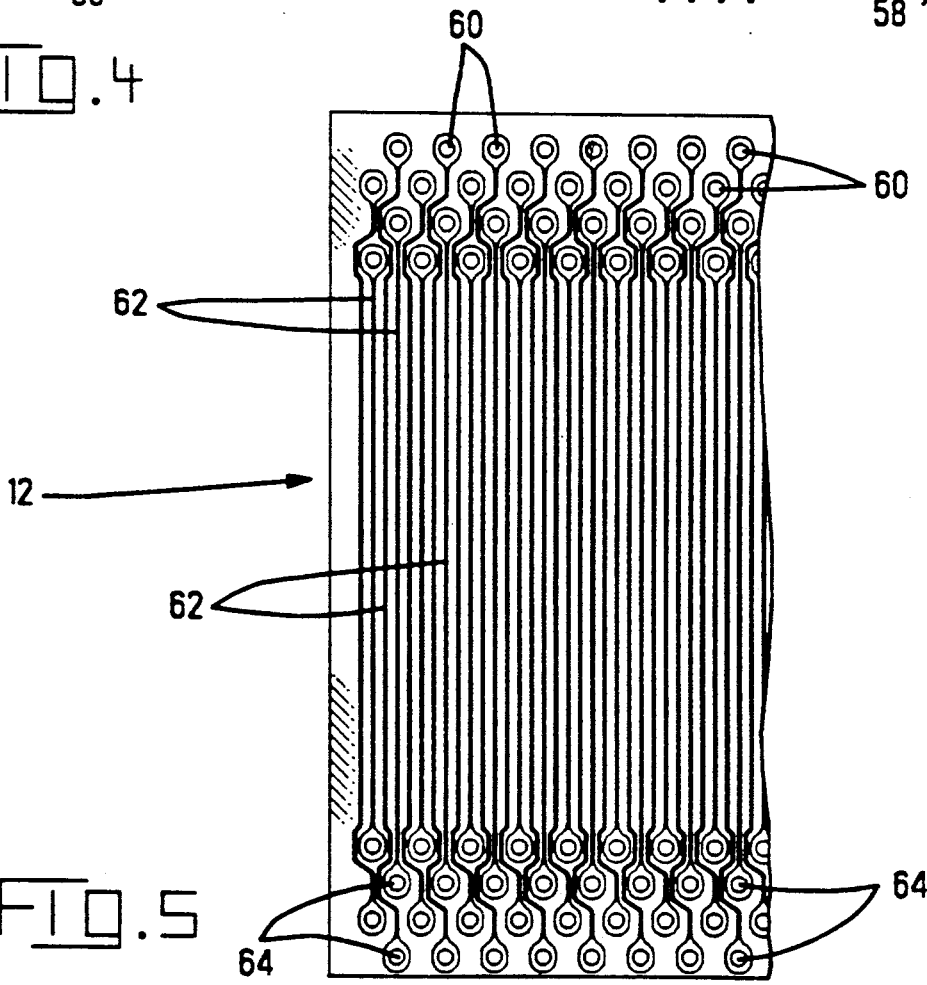
FIG. 5 is a fragmentary rear view of the flat flexible cable before its inclusion in the stacked electrical connector assembly.
Figure 7:
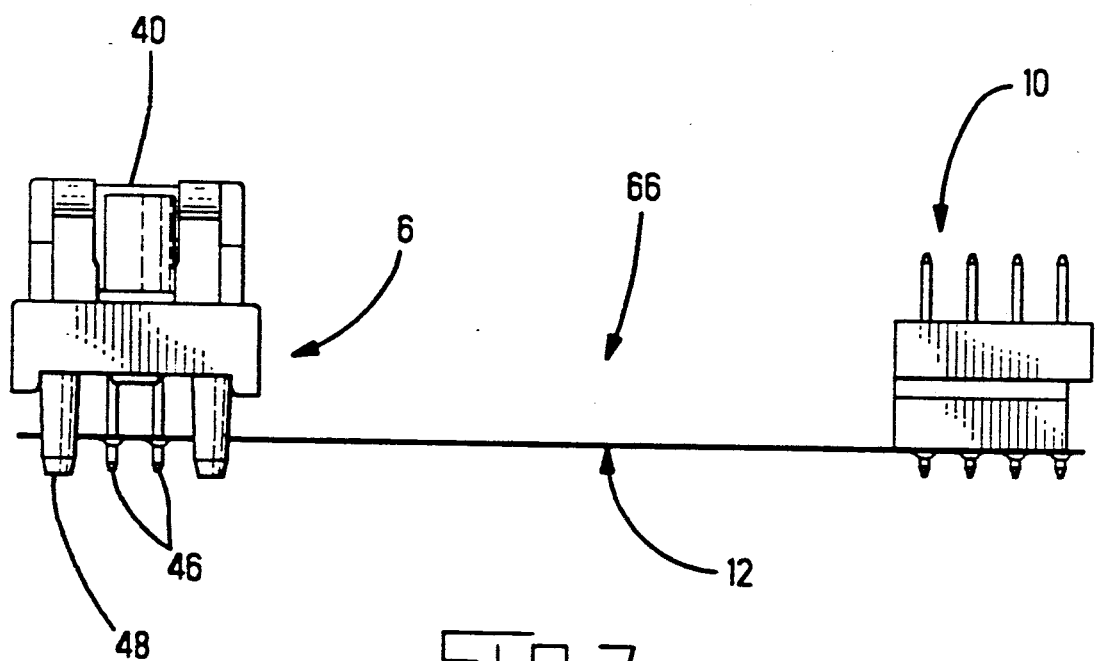
FIG. 7 is an elevational view drawn to the same scale of FIG. 2, of a subassembly comprising an upper connector, a header and a flexible cable, before the inclusion of the subassembly in the stacked electrical connector assembly.

Each contact tail 46 of connector 6 extends through and is soldered to a respective eyelet 60 of a trace 62 at the upper end of cable 12. The upper part of each pin 54 of pin header 10 extends through and is soldered to a respective eyelet 64 at the lower end of cable 12, each contact tail 46 thereby being electrically interconnected to a respective pin 54. FIG. 5 shows the cable 12 before its inclusion in assembly 2. As shown in FIG. 1, the traces 62 are provided only on that side of the insulation of cable 12 which faces the main plate 16 of bracket 4. Before connector 6, cable 12 and pin header 10 are mounted to bracket 4, the connector 6 and pin header 10 are interconnected by cable 12 forming subassembly 66. The connector 6 and pin header are soldered to cable 12 by a soldering operation mentioned above. The resulting subassembly 66 is shown in FIG. 7. When the subassembly 66 is assembled to bracket 4, the lower end portion of cable 12 is flexed at right angles to the remainder thereof to allow the pin header to be positioned in the assembly 2 as described above. Cable 12 may offer the minimum length electrical path that is practical between the contact tails 46 and pins 54.

Connector 8 is also a standard off the shelf connector comprising an elongate insulating housing 67 having forward mating face 68, rear face 70 and a plurality of electrical terminal receiving cavities 72 opening onto both forward face 68 and rear face 70. Each cavity 72 contains an electrical terminal having a mating portion (not shown) which may be either a pin or receptacle, proximate mating face 68 and a contact tail having a first portion 74 projecting from the face 70 normally thereof and a second portion 76 bent at right angles to portion 74. At each end thereof housing 67 has a mounting lug 78 projecting rearwardly beneath a respective mounting lug 24 of bracket 4 with a through hole aligned with hole 34 of lug 24. The portions 76 of the contact tails have free end parts projecting between lugs 24 and 74 and therebelow.

Figure 6:
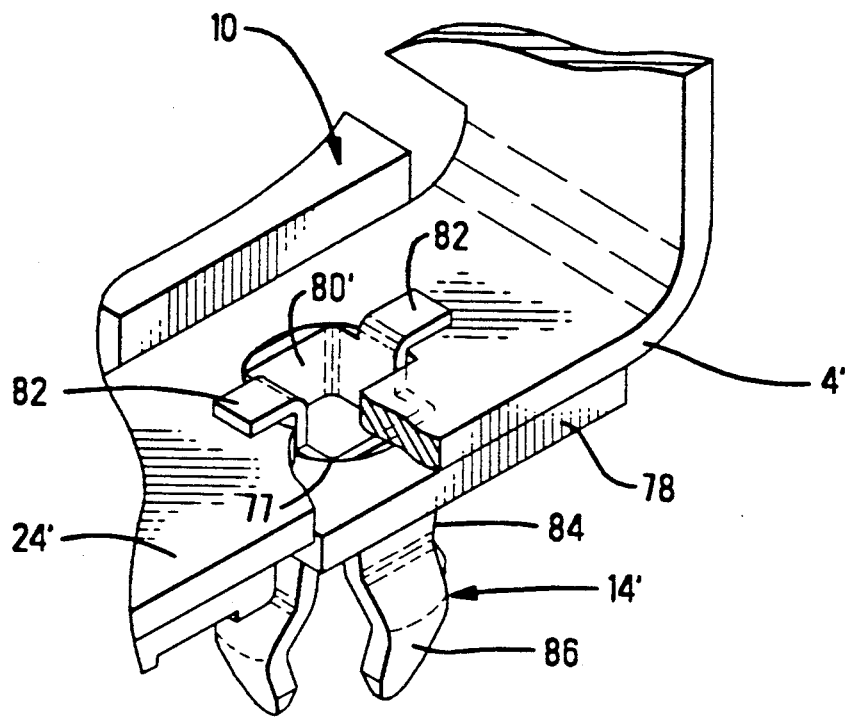
FIG. 6 is a fragmentary isometric view partially cut away of a resilient boardlock of the assembly.
Figure 7A:
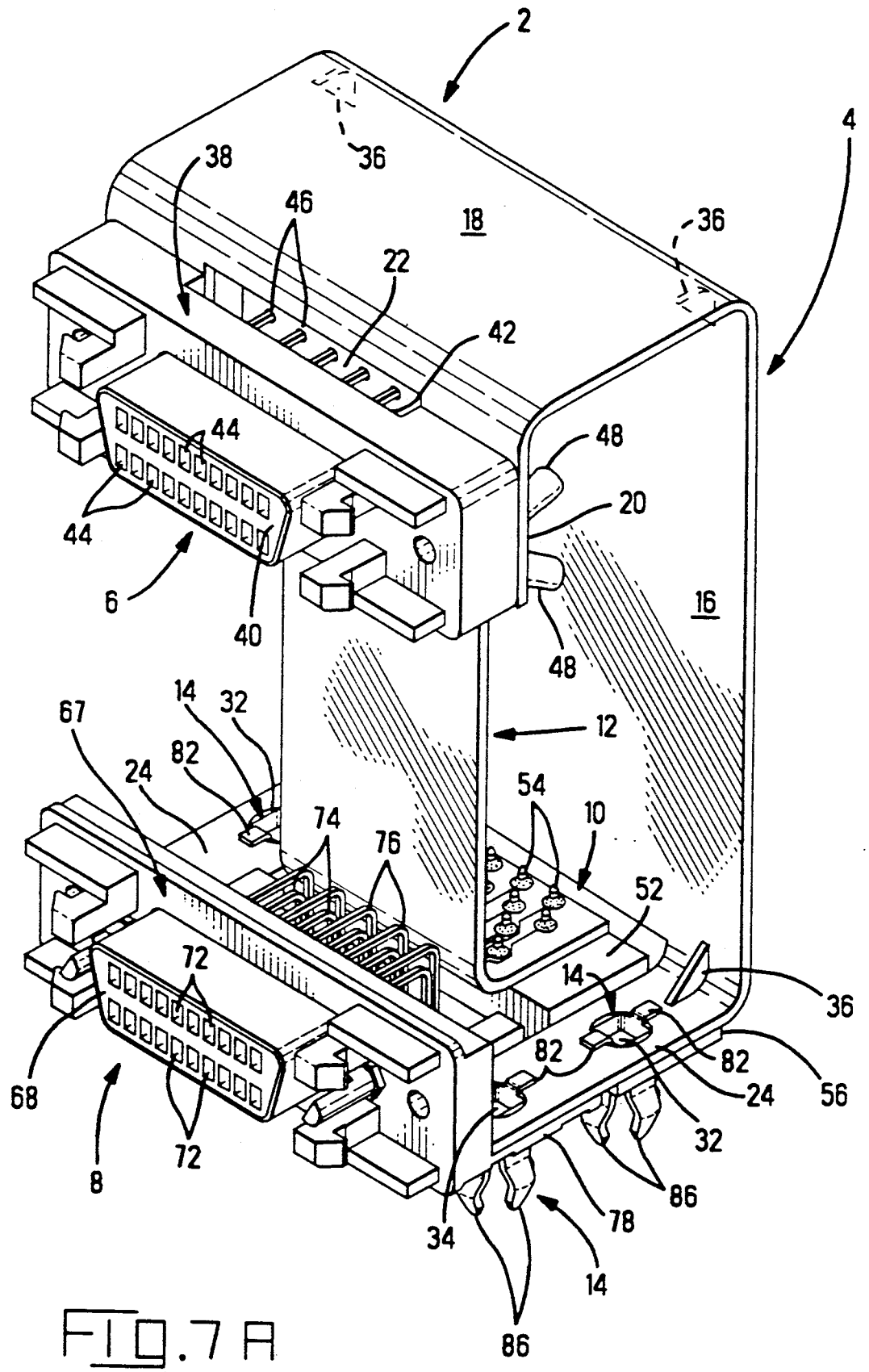
FIG. 7A is a similar view to that of FIG. 1 showing the stacked electrical connector assembly when prepared for mounting on a printed circuit board.

Each boardlock 14 comprises a resilient collar 80 surmounted by stop flanges 82 and from which depends a locking portion 84 terminating in outwardly bowed locking springs 86, in accordance with U.S. Pat. No. 4,842,552 which is hereby incorporated by reference. As shown in FIG. 6, collar 80' of boardlock 14' may be stepped such that the upper surface 81 of the shortened portion 83 of collar 80' engages the under surface of lug 24 with the longer portion 85 of collar 80' being received in the holes 34'. Hole 34' is, in a preferred embodiment, "D" shaped being a chordal section of a circle. With the longer portion 85 of collar 80' received in hole 34' and flanges 82 bent over lug 24, pin header 10 is secured to bracket 4' with lug 24 35 secured between the shortened portion 83 of collar 80' and lugs 82. With the parts of the assembly 2 positioned as shown in FIG. 1, boardlock 14, as shown in FIG. 7A is inserted through each of the mounting holes 32 and 34 in mounting lugs 24 of bracket 4. Each boardlock 14 is thus inserted through each of the respective mounting holes 58 and 77 in the lugs 56 and 78 of connectors 8 and 10, so that the locking springs 86 of the boardlock project freely below the assembly as shown in FIGS. 2 and 7A. In the inserted position of the boardlocks, stop flanges 82 of the boardlocks rest on upper surfaces of lugs 24, the resilient collars 80 of the boardlocks firmly engage the walls of said mounting holes 32 and 34 so that bracket 4 retains pin header 10 and connector 8 in their assembled positions.

The assembly 2 is now ready for mounting to a circuit board, CB, as shown in FIG. 7B by passing the downwardly projecting end portions of pins 54 and the contact tail portion 76 through appropriately located holes H1 and H2 of an array thereof in the CB and passing the downwardly projecting locking springs 86 of the boardlocks 14 through larger holes H3 in the CB. The holes H3 are located on either side of the array of holes H1 and H2 whereby the springs 86 engage the underside of the CB to secure the assembly thereto for a subsequent soldering operation such as a wave solder. Soldering electrically connects pins 54 and the tail portion 76 to conductors (not shown) on the underside of the CB. Larger holes H3 extend through grounding conductors (not shown) on the CB so that the bracket 4 is securely grounded by ways of springs 86. The assembly 2 on the CB may be mounted to panel P by passing the forwardly connecting portions 6 and 8 to then through respective holes H4 in panel P. FIG. 7B does not show the upper part of the panel P and so does not show the upper ones of the holes H4.

Bracket 4 is semi-rigid but is sufficiently flexible to allow the assembly 2 to be readily mounted to panel P even where the connectors 6 and 8 are not relatively positioned for exact alignment with the holes H4. The assembly 2 may alternatively be mounted for use on the CB so as to be free standing without the support of panel P. The flexibility of the bracket enables the connectors 6 and 8 to engage with panel openings which are not precisely aligned.

Figure 8:
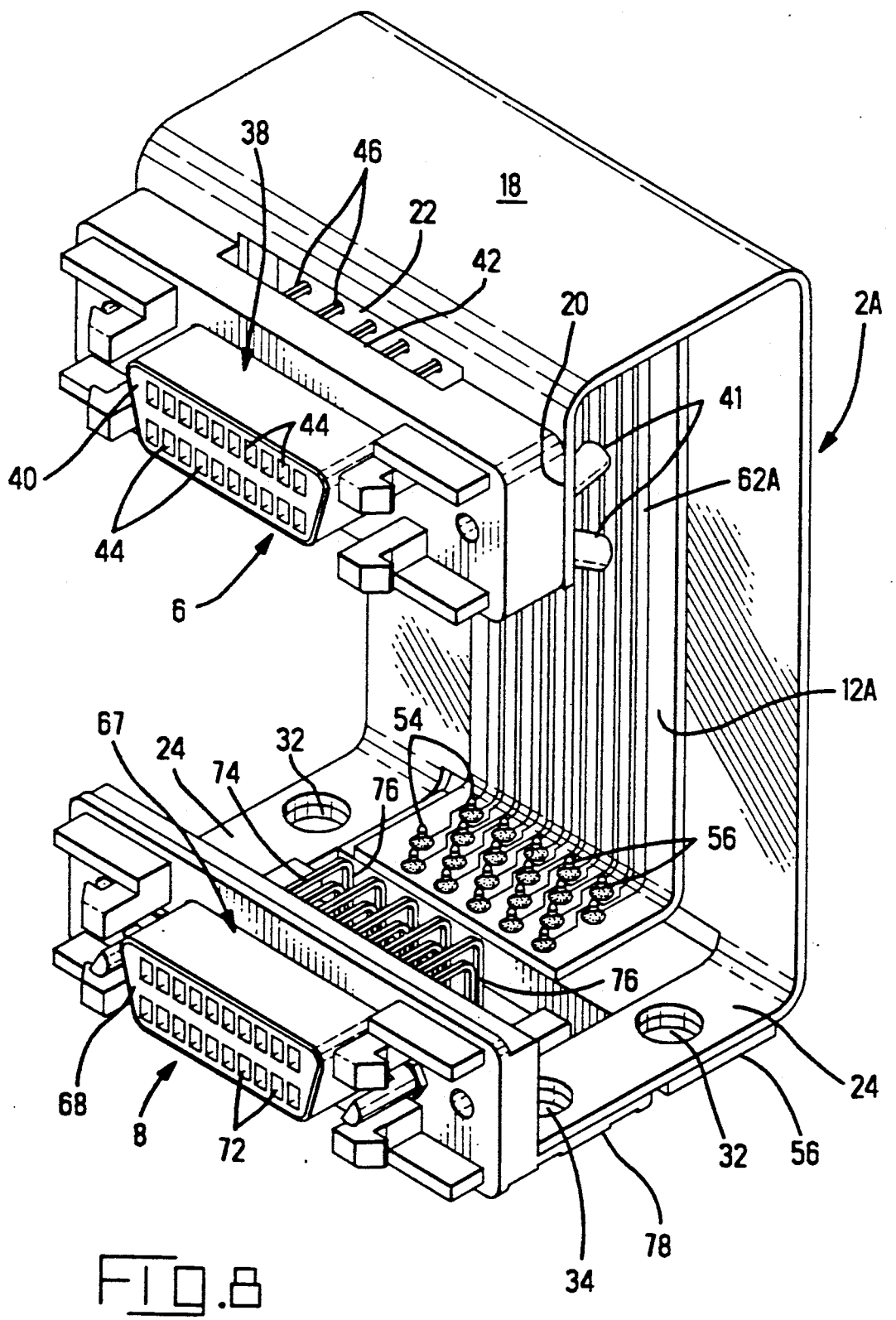
FIG. 8 is a view similar to that of FIG. 1 illustrating a stacked electrical connector assembly according to another embodiment of the invention.

In FIG. 8 elements that have already been described above have the same reference numeral as in stacked connector assembly 2 with the suffix letter A. Stacked connector assembly 2A includes a flat flexible cable 12A which provides a longer electrical path than cable 12 in assembly 2. Cable 12A extends rearwardly from pin header 10 and along the inside of flange 18 with the traces 62A of cable 12A typically being provided on the side of cable 12A remote from main plate 16 and flange 18.

Figure 9:
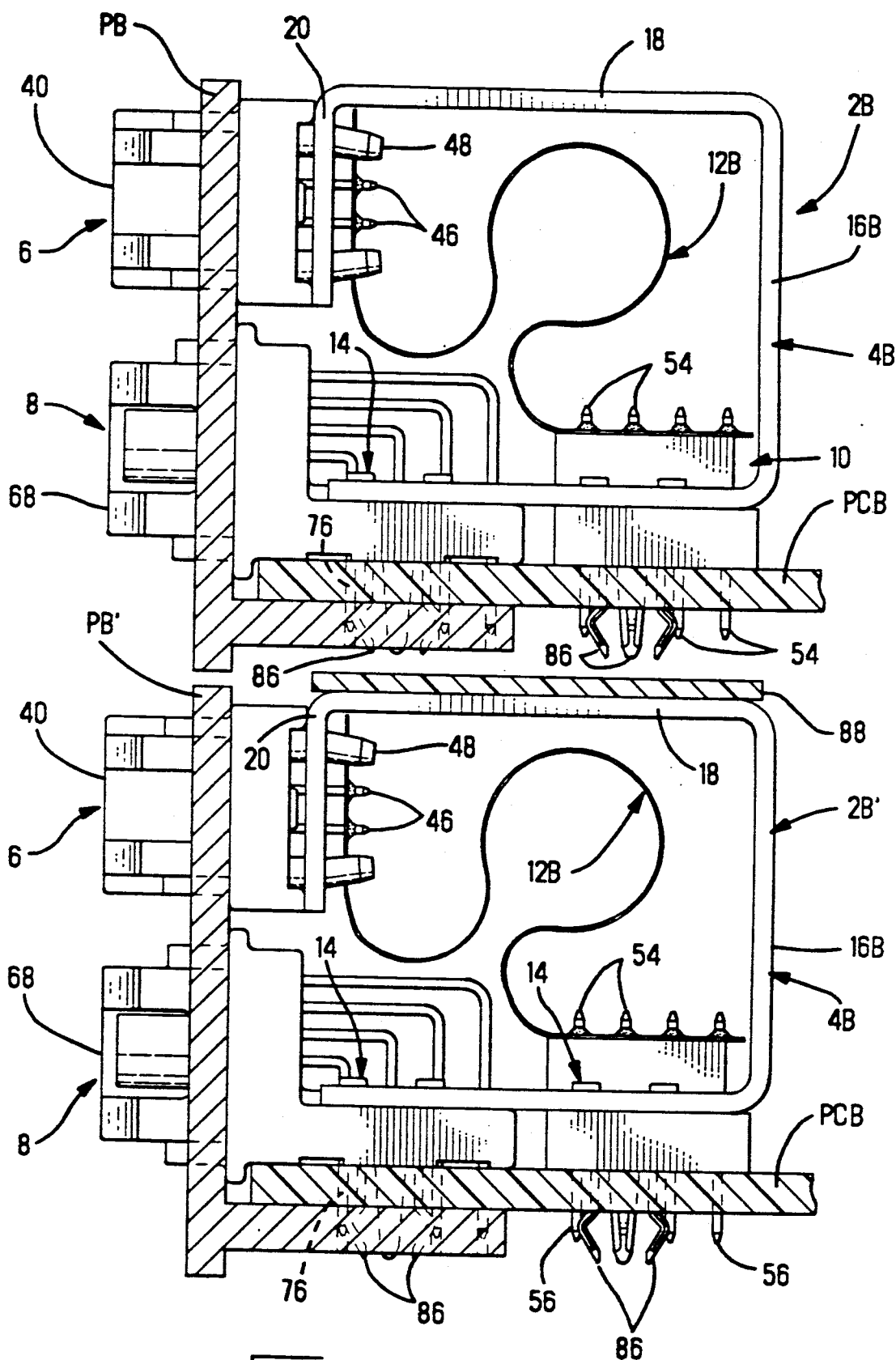
FIG. 9 is a vertical section of two stacked electrical connector assemblies in accordance with a further embodiment of the invention, said assemblies being arranged in stacked relationship.

As shown in the embodiment of FIG. 9, elements that have already been described above with respect to FIGS. 1 to 7B are identified by the same reference numerals, and elements that have a similar function to those described above, but which are different therefrom, have the same reference numerals as the parts described above with a suffix letter B. In the embodiment shown in FIG. 9, the upper and lower stacked electrical connector assemblies 2B and 2B', respectively, which have been mounted to panels PB and PB', respectively, are mounted in the same manner as assembly 2 was mounted to panel P. In this embodiment, connectors 6 and 8 of each assembly 2B and 2B' are more closely spaced vertically, than the connectors 6 and 8 of the assembly 2. The flat flexible cable 12B is of the same length as cable 12 and bracket 4B of each assembly 2B and 2B' are appropriately dimensioned to account for the smaller spacing between connectors 6 and 8. To this end, the main plate 16B of each bracket 4B is substantially shorter in the vertical direction than the main plate 16, the cable 12B therefore forming a loop within bracket 4B. In order to avoid electrical contact between the pins 54 and the springs 86 of the upper assembly 2B and the flange 18 of the bracket 4B of the lower assembly 2B', an insulative sheet 88, for example MYLAR, may be adhered to the outer surface of flange 18 of the lower assembly 2B'.

Figure 10:
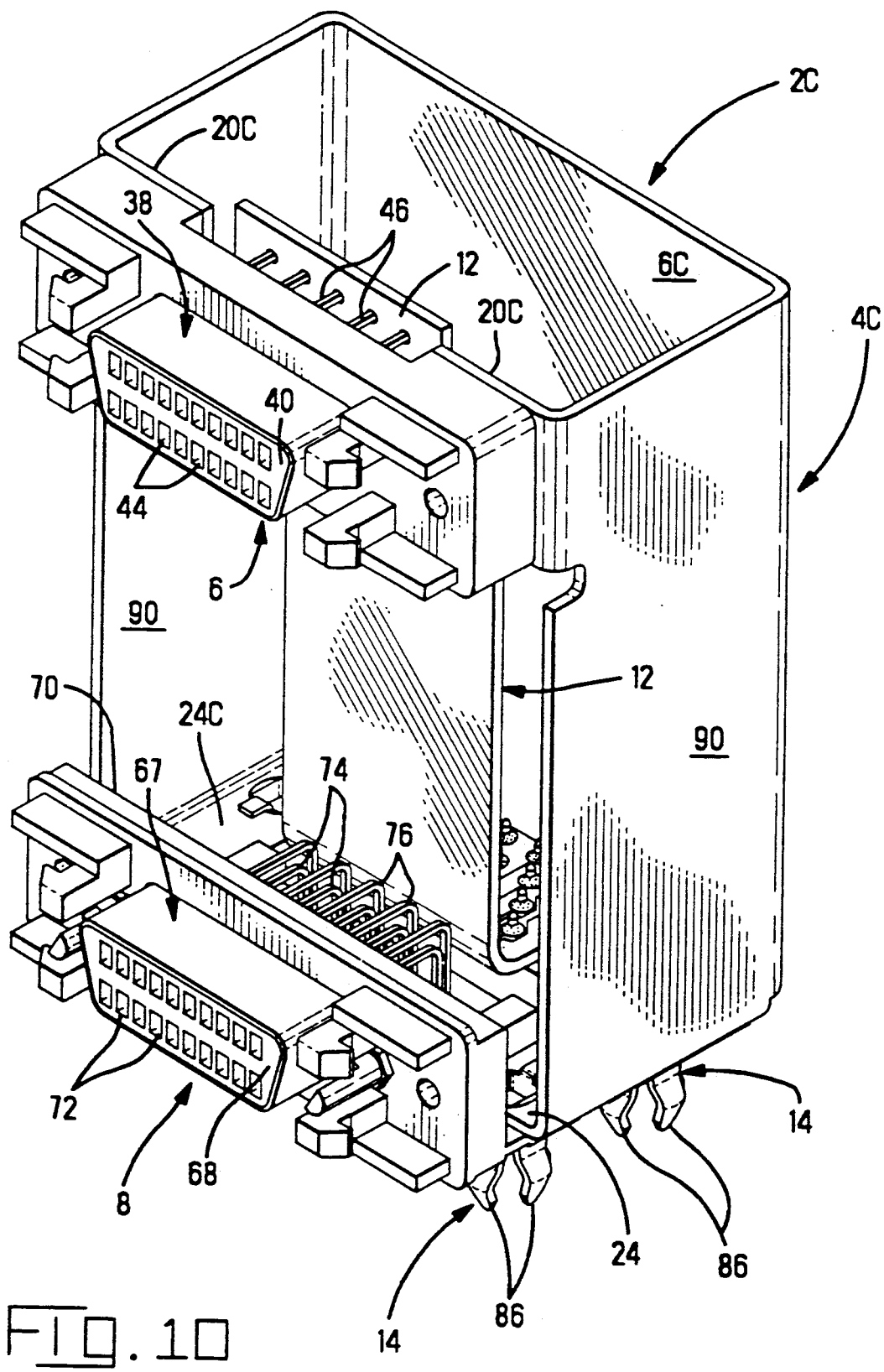
FIGS. 10 to 14 are isometric views of stacked electrical connector assemblies according to additional respective embodiments of the invention.

As an alternative to providing an insulative sheet 88 where a plurality of stacked connector assemblies are to be stacked, the flange 18 may be omitted as shown in FIG. 10. In this embodiment in which elements that have already been described above with reference to FIGS. 1 to 7B are identified by the same reference numerals as those elements, and elements that have the same function as elements in FIGS. 1 to 7B but which are nevertheless different have the same reference numeral with the addition of a suffix letter C. In this embodiment the main plate 16C of the bracket 4C is provided with the side walls 90 from the upper parts of which mounting lugs 20C are bent inwardly at right angles to the side walls 90. Connector 6 is mounted on and secured to lugs 20C thereby being supported by bracket 4C. In addition to providing support for lugs 20C, side walls 90 serve to improve the shielding that is provided by bracket 4C and to provide a grasping surface for ease of handling. Mounting lugs 24C are bent inwardly from the bottom of the side wall 90. Connector 8 is mounted on and secured to lugs 24C thereby being supported by bracket 4C. This design provides an open top to prevent the shorting problems discussed above and also provides an alternative to the bracket previously described.

A stacking bracket in accordance with the present invention may be laterally dimensioned to accommodate more than two electrical connectors. For example, a plurality of upper connectors and one lower connector may be employed, or a plurality of lower connectors and one upper connector may be employed, or a plurality of both upper and lower connectors may be employed with not all of the connectors necessarily being of the same size, height, type or length.

Figure 11:
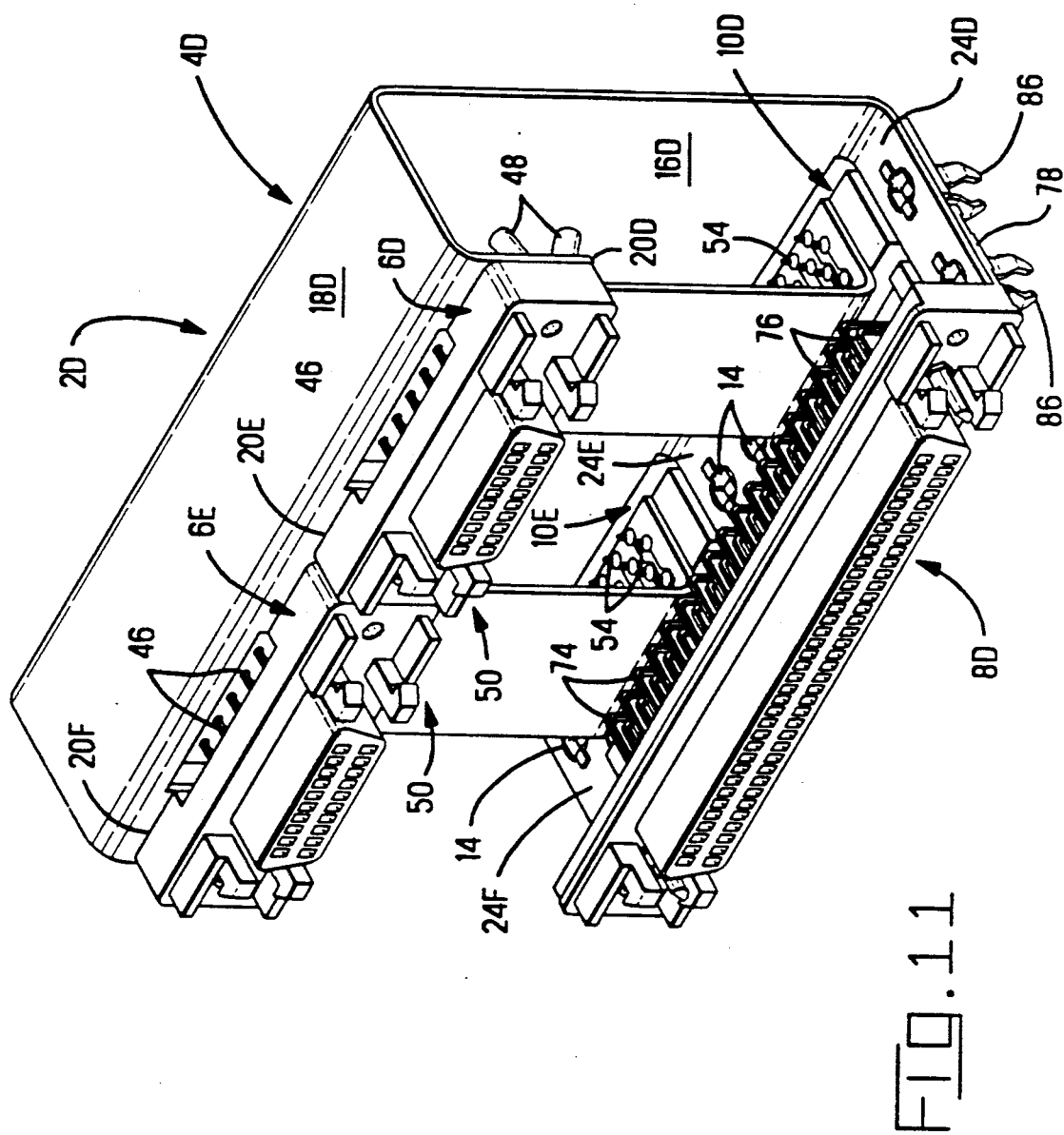

With reference to FIG. 11, in which the elements that have already been described above with reference to FIGS. 1 to 7B are identified by the same reference numerals as in FIGS. 1 to 7B and those elements that have a similar function to elements in FIGS. 1 to 7B but which are different have the same reference number but with the addition of the suffix letters D, E or F. In the embodiment shown in FIG. 11 a stacked electrical connector assembly 2D includes a laterally elongate bracket 4D comprising a main plate 16D having a top flange 18D from the forward edge of which depend three longitudinally spaced mounting lugs 20D, 20E and 20F respectively. There extend forwardly from the lower edge of the main plate three rectilinear mounting lugs 24D, 24E and 24F, respectively. The center lug, 24E, is substantially half the length of the outer lugs 24D and 24F. Center lug 24E is also substantially twice the outer lug width. Two shorter connectors 6D and 6E, similar to connector 6 are secured to lugs 20D and 20F in the manner described above with respect to FIGS. 1 to 7B. Lug 20E is longer in the horizontal direction than each of lugs 20D and 20F. Lug 20E is common to connectors 6D and 6E. Two pin headers 10D and 10E, which are substantially identical to pin header 10, have their pins 54 connected to respective contact tails 46 of the respective connectors 6D and 6E by means of flat flexible cables 12D and 12E, in the manner described above with reference to connector 6, cable 12 and pin header 10. A lower connector 8D which is similar to connector 8 described above but which is substantially twice the length of each connector 6D and 6E has its mounting lugs 78 secured to the mounting lugs 24D and 24F by means of boardlocks 14 in the manner described above with reference to connector 8 and the mounting lugs 24. The mounting lugs 56 of the pin headers 10D and 10E are similarly secured to the respective mounting lugs 24D, 24E and 24F also by means of boardlocks 14.

As can be appreciated from the foregoing disclosure, a connector assembly in accordance with the present invention can incorporate the standard off the shelf electrical connectors and boardlocks. The dimensions of the stacking bracket can be selected in accordance with the dimension of the connectors. The bracket provides a ground path to a ground on the circuit board. Any convenient number, size and type of connector can be stacked, the bracket being suitably dimensioned to this end. The bracket provides shielding for the circuitry of the assembly and also provides physical protection of the contact tails. A plurality of assemblies can be stacked themselves without short circuiting one to another. The bracket being semi rigid compensates for misalignment between the assembly and a pair of spaced mating cut outs on a users panel through which the connectors in the bracket pass. The length of flexible cable can be selected to function with a range of stacking heights. The flexible cable can provide a ground plane for controlled impedance. The flexible cable can be dimensioned to provide minimum signal path length between the upper connector and the pin header.

Figure 12:
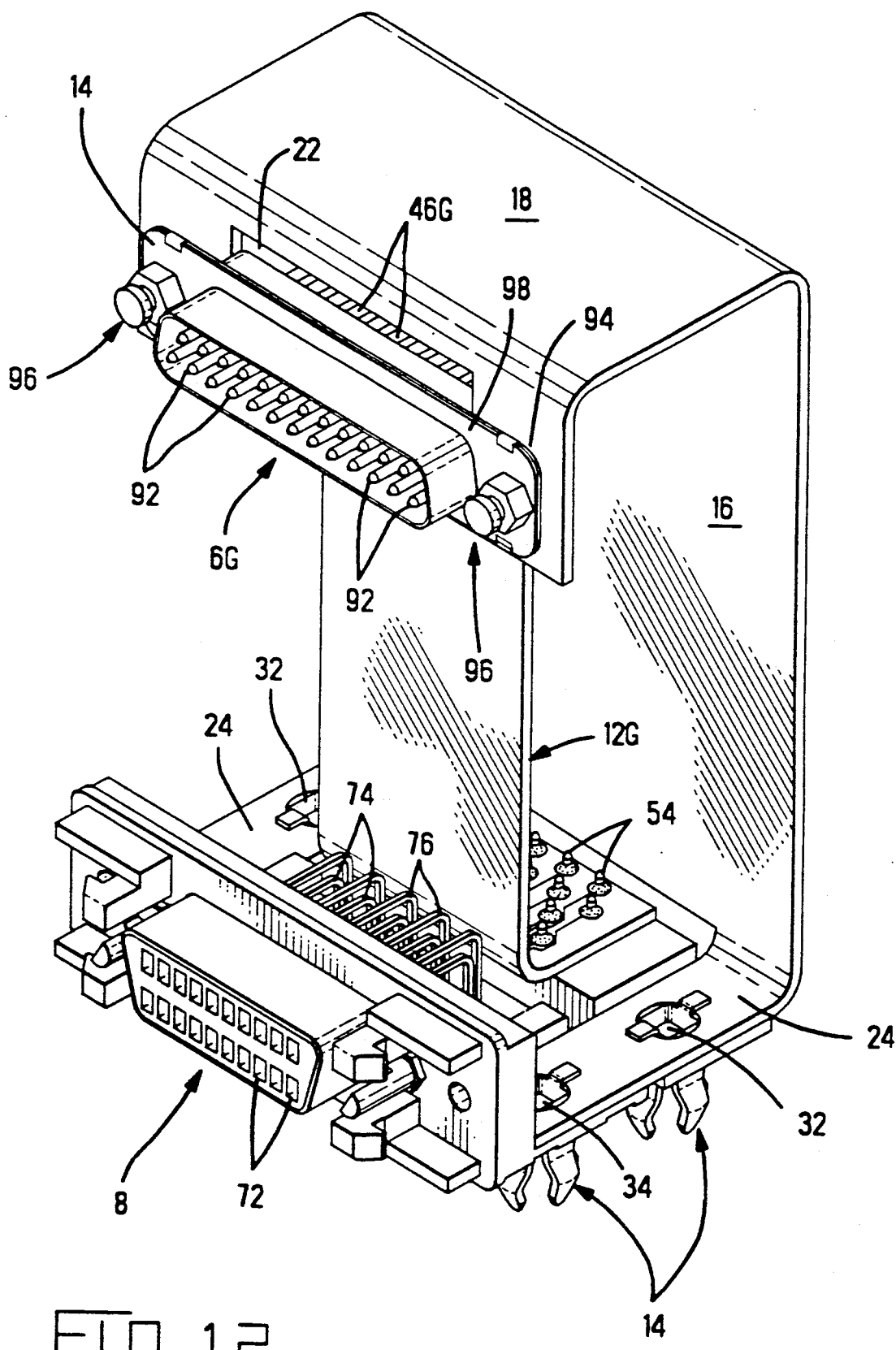
Figure 13:
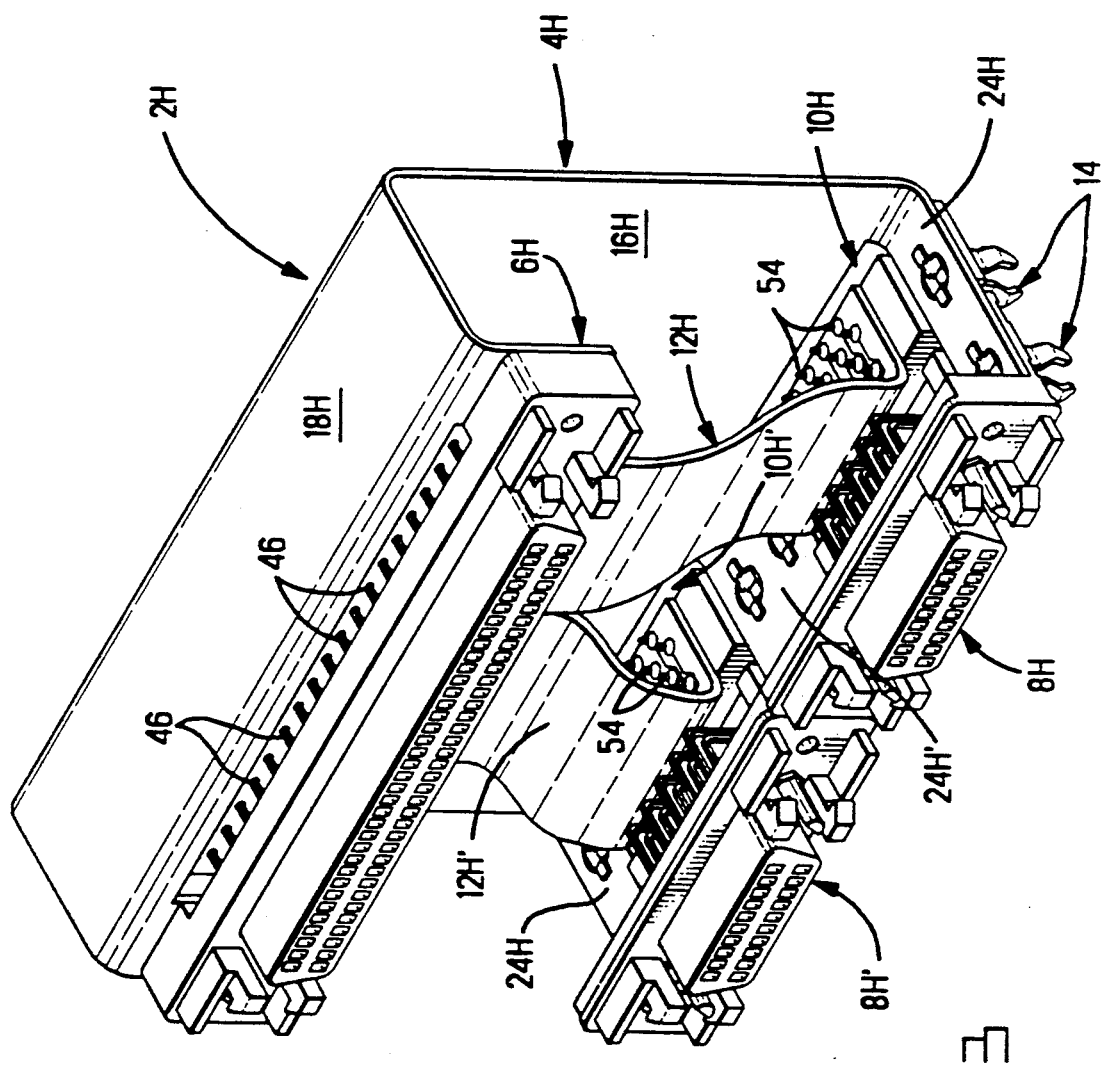
Figure 14:
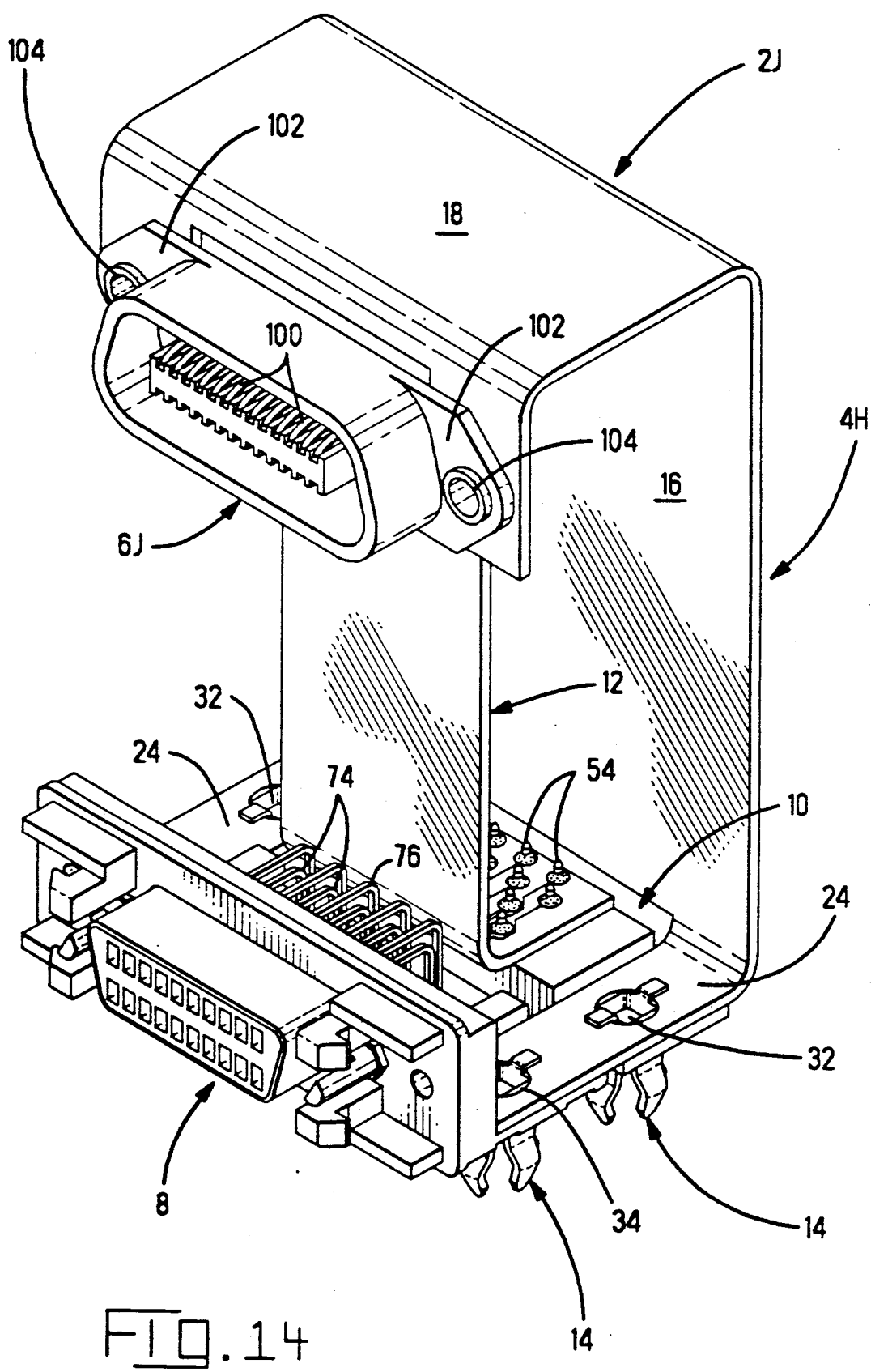

The embodiments in FIGS. 12 to 14 further illustrate the versatility of a stackable electrical connector assembly in accordance with the present invention. In these figures, elements that have already been described above with respect to FIGS. 1 to 7B are identified by the same reference numerals and those elements that have a similar function to elements of FIG. 1 to 7B are identified with the same reference numeral having a suffix letter G when referring to FIG. 12, H when referring to FIG. 13 and J when referring to FIG. 14.

Assembly 2G shown in FIG. 12 has an upper connector 6G which is different from the lower connector 8 in that connector 6G is a pin connector having 26 pins 92 whereas connector 6 is a receptacle connector having 25 positions as in the case of assembly 2. The connector 6G has mounting flanges 94 which are secured to the mounting lugs 20G by means of nut and bolt fasteners 96 which also serve to electrically connect a shield 98 of the connector 6G to the lug 20G. The flat flexible cable 12G has the appropriate number of traces, the pin header 10G having the appropriate number of pins 54.

In the embodiment of FIG. 13, the assembly 2H has a larger upper connector 6H and two smaller (shorter) lower connectors 8H and 8H'. Pin headers 10H and 10H' are located behind connectors 8H and 8H' respectively. The pins 54 of each header are interconnected to the respective contact tails 46 of connector 6H by means of flexible cables 12H and 12H', respectively. Cables 12H and 12H' may be separate cables or be a single cable that has been split. As described above with reference to FIG. 11, the bracket has a central mounting lug 24H' which is common to the two headers.

In the embodiment of FIG. 14 the assembly 2J, which is otherwise substantially the same as the assembly 2, has an upper connector 6J which is of a different kind from the lower connector 8. The upper connector is in the form of a jack having spring contact 100 and mounting lugs 102 which are fixed to flanges 20H of the bracket 4H by means of rivets 104.

Figure 15:
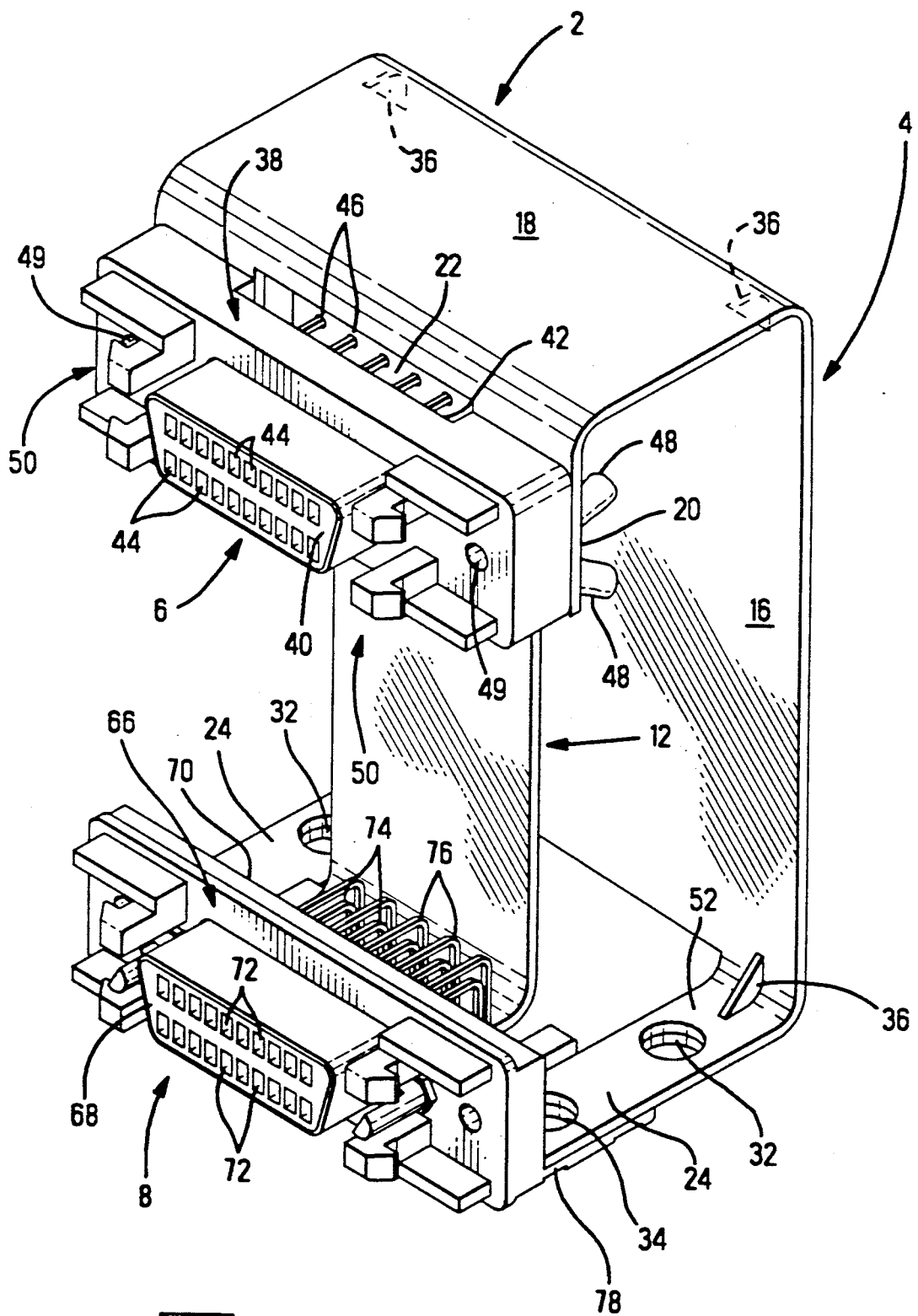
FIG. 15 is an isometric view of a bussing connector incorporating the bracket of the present invention.

A bussing connector is shown in FIG. 15 in which cable 12 interconnects respective contacts in the upper connector 6 with respective contacts in the lower connector 8. In this manner the respective contacts in the upper and lower connectors are wired in parallel. Pin header 10 is not required in this bussing connector. Traces 62 are soldered to respective contacts of connector 6 at one end and to corresponding respective contacts of connector 8 at the other end, thereby electrically commoning each contact in connector 6 with a corresponding contact in connector 8.

While the invention has been described as employing a flexible circuit board to interconnect the contacts of the upper connector to corresponding ones of the pins of the pin header, other means may be employed such as providing the upper connector with terminals of sufficient length to extend beyond the lower surface of the lower lugs to be received in plated through holes in the circuit board on which the stacked assembly is mounted on having an upper connector and the pin header with insulation piercing or displacing terminals interconnected by conductors such as a ribbon cable.

We claim:

1. A stacked electrical connector assembly for mounting on a circuit board, the assembly comprising;
   a first and a second electrical connector each having terminals arranged in at least one row, each connector having a forward mating face and a rear face, said faces extending lengthwise of said at least one row of terminals and each connector defining first and second ends, said first end of each of the connectors being at one end of said at least one row of terminals and said second end of each of the connectors being at the other end thereof; and
   a single upstanding one-piece connector support bracket stacking the first connector over the second connector, and extending horizontally and lengthwise of said mating faces and said rear faces at least from the first to the second end of each of said connectors, the support bracket having means fixed to the first and second ends of the first and second electrical connectors, whereby both ends of both connectors are fixed to the bracket.

2. A stacked electrical connector assembly as recited in claim 1, further comprising means for interconnecting the terminals of the upper connector to traces on the circuit board.

3. A stacked electrical connector assembly as recited in claim 2, wherein the interconnecting means comprises a flexible cable.

4. A stacked electrical connector assembly as recited in claim 1, further comprising circuit means for interconnecting corresponding ones of the terminals of the first connector with respective ones of the terminals of the second connector.

5. A stacked electrical connector assembly as recited in claim 4, wherein the circuit means is a flat flexible cable.

6. A stacked electrical connector assembly as recited in claim 1, wherein the bracket further comprises a main plate and wherein the first electrical connector support means comprises upper mounting lugs extending from the main plate for supporting the first and second ends of the first connector and wherein the second electrical connector support means comprises lower mounting lugs extending from the main plate for supporting the first and second ends of the second connector.

7. A stacked electrical connector assembly as recited in claim 6, wherein the upper mounting lugs extend from an upper edge of the main plate and the lower mounting lugs extend from a lower edge of the main plate.

8. A stacked electrical connector assembly as recited in claim 6, wherein the main plate defines first and second side edges, a mounting lug for supporting the first end of said first connector and a mounting lug for supporting the first end of the second connector extend from said first side edge, and a mounting lug for supporting the second end of said first connector and a mounting lug for supporting the second end of said second connector extend from said second side edge.

9. A stacked electrical connector as recited in claim 1, further comprising a third electrical connector having terminals and defining first and second mounting flanges, said bracket further comprising means connected to and supporting the first and second mounting flanges of the third electrical connector.

10. A stacked electrical connector assembly as claim 9, wherein the third electrical connector is mounted adjacent said first electrical connector.

11. A stacked electrical connector assembly as claim 9, wherein the third electrical connector is mounted adjacent said second electrical connector.

12. A stacked electrical connector assembly for mounting on a circuit board, the assembly comprising;
a first electrical connector having terminals and defining first and second ends;
a second electrical connector having terminals and defining first and second ends; and
a single upstanding one-piece connector support bracket stacking the first connector over the second connector, and extending horizontally at least from the first to the second end of each of the connectors, the support bracket supporting the first and the second ends of the first and second electrical connectors, whereby both ends of both connectors are supported by the bracket, the assembly further comprising means for interconnecting the terminals of the upper connector to traces on the circuit board, the interconnecting means further comprising a pin header having pins.

13. A stacked electrical connector assembly as recited in claim 12, further comprising circuit means for interconnecting corresponding ones of the terminals of the first connector with respective pins of the pin header.

14. A stacked electrical connector assembly as recited in claim 12, further comprising boardlock means secured to the assembly, said boardlock means securing the pin header to the bracket.

15. A stacked electrical connector assembly for mounting on a circuit board, the assembly comprising:
a single upstanding one-piece connector supporting-bracket having upper and lower connector supporting means;
at least one upper electrical connector mounted to the upper supporting means and having a first elongate insulating housing, having a forward mating face and a rear face extending lengthwise of said housing, and having first and second ends at respective ends of said mating and rear faces, said housing defining a plurality of through cavities, each receiving an electrical terminal having a contact tail projecting from said cavity and a mating portion for mating with a complementary electrical connector, both of said ends of said first housing being fixed to said upper supporting means and said connector supporting bracket extending horizontally and lengthwise of said mating and rear faces at least from the first to the second end of said first insulating housing;
at least one lower electrical connector mounted to said lower supporting means and having a second elongate insulating housing having a forward mating face and a rear face extending lengthwise of said second housing and first and second ends at respective ends of the mating and rear faces of said second housing and through which housing extend a plurality of electrical pins both of the first and the second ends of such housing being fixed to said lower supporting means, said supporting bracket extending horizontally and lengthwise of the said mating and rear faces of said second housing at least from said first to said second end thereof; and
at least one flexible electrical circuit having a plurality of electrically conductive traces each connected to a respective one of said contact tails and to a respective one of said electrical pins.

16. An assembly as claimed in claim 15, wherein said bracket comprises an upright main metal plate, said upper supporting means comprising a plurality of upper connector mounting lugs projecting from said main plate, said lower supporting means comprising a plurality of lower connector mounting lugs extending from a bottom edge of said bracket normally of said main plate.

17. An assembly as claimed in claim 16 wherein the upper connector mounting lugs have openings therethrough, grounding pins on said at least one upper connector being secured in said openings, and said contact tails extending between the upper connector mounting lugs.

18. A stacked electrical connector assembly for mounting on a circuit board, the assembly comprising:

a connector supporting bracket having upper and lower connector supporting means;

at least one upper electrical connector mounted to said upper supporting means and having a first insulating housing defining a plurality of through cavities, each receiving an electrical terminal having a contact tail projecting from said cavity and a mating portion for mating with a complementary electrical connector;

at least one lower electrical connector mounted to said lower supporting means and having a second insulating housing through which extend a plurality of electrical pins; and at least one flexible electrical circuit having a plurality of electrically conductive traces each connected to a respective one of said contact tails and to a respective one of said electrical pins wherein said bracket comprises an upright main metal plate, said upper supporting means comprising a plurality of upper connector mounting lugs projecting from said main plate, said lower supporting means comprising a plurality of lower connector mounting lugs extending from a bottom edge of said bracket normally of said main plate, and wherein said at least one lower connector has laterally projecting flanges extending beneath the lower connector mounting lugs, boardlocks extending through hoes in said flanges and said lugs to secure said lower connector thereto and for grounding said bracket to said circuit board.

19. An assembly as claimed in claim 18, further comprising at least one further lower electrical connector having an insulating housing defining a plurality of through cavities each receiving an electrical terminal having a contact tail projecting below the lower connector mounting lugs for insertion in holes in said circuit board and a mating portion for mating with a complimentary electrical connector, lateral flanges on said at least one further lower electrical connector extending beneath said lower connector mounting lugs and further spring locking clips extending through holes in said lower connector mounting flanges and holes in said lateral flanges of said lower electrical connectors to secure it to said bracket.

20. A stacked electrical connector assembly for mounting on a circuit board, the assembly comprising:
a connector supporting bracket having upper and lower connector supporting means;

at least one upper electrical connector mounted to said upper supporting means and having a first insulating housing defining a plurality of through cavities, each receiving an electrical terminal having a contact tail projecting from said cavity and a mating portion for mating with a complementary electrical connector;

at least one lower electrical connector mounted to said lower supporting means and having a second insulating housing through which extend a plurality of electrical pins; and at least one flexible electrical circuit having a plurality of electrically conductive traces each connected to a respective one of said contact tails and to a respective one of said electrical pins, and wherein said bracket is a one piece sheet metal bracket comprises an upright main plate and a top plate extending normally therefrom, said upper connector mounting means comprising a plurality of upper connector mounting lugs depending from an edge of said top plate remote from said main plate, parallel to said main plate, said lower connector mounting means comprise mounting lugs projecting from the bottom of said main plate parallel to said top plate.

21. An assembly as claimed in claim 20, wherein said flexible circuit extends from said upper connector along the lower face of said top plate and along said main plate, said traces being provided on a side of said circuit remote from said top plate and said main plate.

22. An assembly as claimed in claim 20, wherein said bracket is so dimensioned that said flexible circuit extends rectilinearly between said upper and lower connectors.

23. An assembly as claimed in claim 20, wherein said bracket is laterally dimensioned to accommodate a plurality of upper connectors and a plurality of lower connectors, said upper and lower connector supporting means comprising a series of connector mounting lugs spaced from each other laterally of said bracket.

24. An assembly as claimed in claim 20, wherein said bracket is so dimensioned that said flexible circuit forms a loop between said upper and lower connectors.

25. An assembly as claimed in claim 24, wherein the upper and the second lower electrical connectors are of different types.

26. A stacked electrical connector assembly for mounting on a circuit board, the assembly comprising:
a connector supporting bracket having upper and lower connector supporting means;

at least one upper electrical connector mounted to said upper supporting means and having a first insulating housing defining a plurality of through cavities, each receiving an electrical terminal having a contact tail projecting from said cavity and a mating portion for mating with a complementary electrical connector;

at least one lower electrical connector mounted to said lower supporting means and having a second insulating housing through which extend a plurality of electrical pins; and at least one flexible electrical circuit having a plurality of electrically conductive traces each connected to a respective one of said contact tails and to a respective one of said electrical pins, and wherein said bracket is a one piece sheet metal bracket comprises an upright main plate and a pair of sade plates projecting from opposite edges of said main plate normally thereof, said upper connector mounting means comprising mounting lugs projecting from said edges of said side plates removed from said main plate and parallel thereto, said lower connector mounting means comprising mounting lugs projecting from bottom edges of said side plates normally thereof, the top of said bracket being open.

27. A stacked electrical connector assembly for mounting on a circuit board, the assembly comprising;
a sheet metal connector supporting bracket comprising an upright main plate having upper and lower connector mounting lugs projecting therefrom;

at least one upper electrical connector mounted to said upper supporting lugs and having a first insulating housing defining a plurality of through cavities each opening into a mating face of the housing, which face is parallel to and faces away from said main plate and into a rear face of the housing which face is opposite to said mating face, each cavity receiving an electrical terminal having a contact tail projecting from said cavity towards said main plate and a mating portion proximate to said mating face, for mating with a complementary electrical conductor;

at least one first lower electrical connector mounted to said lower supporting lugs and having a second insulating housing through which extend a plurality of electrical pins each having an upper portion protruding upwardly from said second housing and a lower portion protruding downwardly therefrom for insertion in a hole in a circuit board;

at least one flat flexible electrical cable having a plurality of electrically conductive traces each connected to a respective one of said contact tails and to a respective one of said pin upper portions; and at least one second lower electrical connector mounted to said lower connector mounting lugs on the opposite side of said first lower electrical connector to said main plate, said second lower electrical connector having an insulating housing defining a plurality of through cavities each opening into a mating face and an opposite rear face of that housing, said rear face being opposite to said mating face and said mating face facing away from said main plate, an electrical terminal in each cavity having a contact tail projecting below the lower connector mounting lugs for insertion in holes in the circuit board and a mating portion proximate to the mating face of said further lower connector, for mating with a complementary electrical conductor.

28. An assembly as claimed in claim 27, comprising a plurality of upper electrical connectors, the same plurality of first lower electrical connectors, and the same plurality of flat flexible cables, the contact tails of each upper electrical connector being connected to the pins of a respective first lower connector by means of a respective one of said cables, there being a single second lower electrical connector which is longer than either of said upper connectors.

29. An assembly as claimed in claim 28, wherein the upper and second lower electrical connectors are of different types.

30. An assembly as claimed in claim 27, comprising a single upper electrical connector, a plurality of first lower electrical connectors, plurality of flat flexible cables and the same plurality of second lower electrical connectors, the contact tails of the upper electrical connector being connected to respective pins of each of the first lower electrical connectors by means of a respective one of said cables, the upper connector being longer than either of the second lower electrical connectors.

31. An assembly as claimed in claim 30, wherein the upper and second lower connectors are of different types.

* * * * *